(12) United States Patent
Yamamoto et al.

(10) Patent No.: US 6,380,478 B1
(45) Date of Patent: Apr. 30, 2002

(54) SOLAR CELL MODULE

(75) Inventors: Yasuaki Yamamoto, Nara; Wataru Shinohara, Katano; Shinichi Miyahara, Settsu; Shihomi Nakatani, Moriguchi; Haruhisa Hashimoto, Suita; Toshio Yagiura, Kadoma; Eiji Maruyama, Katano; Makoto Nakagawa, Kadoma, all of (JP)

(73) Assignee: Sanyo Electric Co., Ltd., Osaka-fu (JP)

( * ) Notice: Subject to any disclaimer, the term of this patent is extended or adjusted under 35 U.S.C. 154(b) by 0 days.

(21) Appl. No.: 09/617,677

(22) Filed: Jul. 14, 2000

(30) Foreign Application Priority Data

| Jul. 16, 1999 | (JP) | ............................................ | 11/203481 |
| Jul. 16, 1999 | (JP) | ............................................ | 11/203482 |
| Aug. 25, 1999 | (JP) | ............................................ | 11/238974 |
| Aug. 25, 1999 | (JP) | ............................................ | 11/238975 |
| Sep. 16, 1999 | (JP) | ............................................ | 11/262567 |

(51) Int. Cl.$^7$ ............................................ H01L 31/042
(52) U.S. Cl. ................. 136/244; 136/249; 136/251; 136/258; 257/433; 257/443; 257/52
(58) Field of Search .................. 136/244, 249, 136/251, 258; 257/433, 443, 52

(56) References Cited

U.S. PATENT DOCUMENTS 4,287,382 A * 9/1981 French .................. 136/244

FOREIGN PATENT DOCUMENTS

| JP | 6-60155 | | 8/1994 |
| JP | 6-60155 U | * | 8/1994 |

* cited by examiner

*Primary Examiner*—Alan Diamond
(74) *Attorney, Agent, or Firm*—Arent Fox Kintner Plotkin & Kahn, PLLC

(57) ABSTRACT

A plurality of groups of integrated elements (30, 40) comprising a plurality of photovoltaic elements (2) electrically connected in series are provided on a substrate (1) having an insulating surface. The plurality groups of integrated elements (30, 40) are arranged in parallel by interposing a separating part (50). A rear surface member (4) is electrically connected with the plurality of the groups of integrated elements (30, 40) in series and is adhered to a rear surface side of the plurality of groups of integrated elements (30, 40) by interposing an adhesive layer (5) containing resin. The adhesive layer (5) is provided so as to cover a rear surface of the groups of integrated elements (30, 40) except for an area corresponding to the separating part (50).

19 Claims, 13 Drawing Sheets

US 6,380,478 B1

SOLAR CELL MODULE

BACKGROUND OF THE INVENTION

1. Field of the Invention

This invention relates to a solar cell module, particularly relates to a solar cell module capable of outputting a high voltage.

2. Description of Prior Art

A solar power generation system using a solar cell, which does not give harmful effect to the environment, has become popular as a domestic power system.

Crystalline semiconductor material such as single crystalline silicon and polycrystalline silicon, amorphous semiconductor material such as amorphous silicon and amorphous silicon germanium, and compound semiconductor material such as GaAs and CdTe or the like have been used for composing a solar cell. Particularly, a solar cell using amorphous semiconductor material is free from restrictions on selection of a substrate and output design, and can be manufactured at a low cost.

FIG. 1 is a cross-sectional view illustrating a structure of a conventional solar cell module using an amorphous semiconductor.

As shown in FIG. 1, the conventional solar cell module using an amorphous semiconductor includes a plurality of photovoltaic elements 2 mounted on a substrate 1 formed with translucent and insulative material such as glass and plastic. The plurality of photovoltaic elements 2 are cascade-connected with each other and output predetermined electric power. The photovoltaic element 2 comprises a first electrode 11 of conductive translucent material such as tin oxide ($SnO_2$), indium tin oxide (ITO), and zinc oxide (ZnO), a photovoltaic conversion layer 12 of amorphous semiconductor having pin junction inside, and a second electrode 13 of highly reflective material such as Ag and Al or the like laminated in this order. The second electrode 13 is buried in a separating part between the adjacent photovoltaic conversion layers 12 and is contact with the first electrode 11 so that the adjacent photovoltaic elements 2 are electrically connected in series with each other.

A protective layer 3 covers a surface of the photovoltaic elements 2 for preventing a scratch or the like on the surface of the photovoltaic element 2 in the later process. The protective layer 3 is generally formed with epoxy resin. A rear surface member 4 of glass, plastic, steel or the like is adhered on the rear surface of the photovoltaic element 2 through an adhesive layer 5 of thermal plastic resin such as EVA (ethylene vinyl acetate) or the like. The adhesive layer 5 is formed with water-repellent material and prevents moisture from penetrating.

Electromotive force generated by the photovoltaic element 2 is taken out to the external through a lead wire (not shown) from the first and second electrodes of the photovoltaic element 2 arranged on both ends.

FIG. 2 is a schematic view illustrating a general structure of a domestic solar cell system using the above mentioned solar cell module. In FIG. 2, a plurality of solar cell modules 201 are arranged on a roof of a house and direct output from the plurality of the solar cell modules 201 is accumulated and is introduced into a connection box 202. The direct output from the connection box 202 is converted into alternating output by an inverter 203, and is supplied to a load in a house 205 through a distribution board 204. When power supplied from the solar cell modules 201 runs short at night, electric power can be supplied to the load in a house 205 from the commercial power system 206.

Alternating output from the inverter 203 is adjusted to be 100V because the load in a house 205 is for 100V. When considering about a loss in the inverter 203 and a lowered output from the solar cell modules 201 caused by cloud weather, an operating voltage of the solar cell modules 201 which is input to the inverter 203 is preferably about 200V in order to make alternating output of the inverter 203 100V.

Generally an operating voltage per single solar cell module using single crystalline silicon is approximately 50V. When four or five solar cell modules are connected in series and form a group, the operating voltage of approximately 200V is output from the group of solar cell modules and is input to the inverter 203.

A solar cell module using amorphous semiconductor which is free from a restriction on output designs and outputs a higher voltage has been proposed. (JP, 6-60155, U)

A structure of the solar cell module is explained by referring to FIGS. 3–5. FIG. 3 is a plan view of the solar cell module; FIG. 4 is a cross-sectional view along A—A line of FIG. 3; FIG. 5 is a cross-sectional view along the B—B line of FIG. 3. Elements having the same functions have the same numeral references indicated in FIG. 1.

The photovoltaic element 2 is formed on the substrate 1 which is formed with translucent material such as glass and plastic or the like and has an insulating surface. The photovoltaic element 2 comprises a first electrode 11 of translucent material such as $SnO_2$, ITO, or ZnO, a photovoltaic conversion layer 12 of amorphous semiconductor having pin junction, and a second electrode 13 of highly reflective metal material such as Ag and Al or the like laminated in this order.

A first electrode separating part 21 formed by exposing the insulating surface of the substrate 1 separates the adjacent first electrodes 11. A photovoltaic conversion layer separating part 22 formed by exposing a surface of the first electrode 11 separates the adjacent photovoltaic conversion layers 12. A second electrode separating part 23 formed by exposing a surface of the photovoltaic conversion layer 12 separates the adjacent second electrodes 13. The second electrode 13 is buried in the photovoltaic conversion layer separating part 22 so as to make contact with the first electrode 11, thus the adjacent photovoltaic elements 2, 2 are electrically connected in series with each other.

The solar cell module, as shown in FIG. 3, includes a first group of integrated elements 30 comprising a plurality of photovoltaic elements 2 electrically connected in series with each other, and a second group of integrated elements 40 comprising a plurality of photovoltaic elements 2 electrically connected in series with each other. A groove 8 is formed around the first and second groups of integrated elements 30, 40, for preventing leak through the first electrode, the photovoltaic conversion layer, and the second electrode attached to a side surface of the substrate 1 when forming them. The groove 8 is formed by removing the first electrode 11, the photovoltaic conversion layer 12, and the second electrode 13, and exposing the insulating surface of the substrate 1.

The first group of integrated elements 30 and the second group of integrated elements 40 are arranged in parallel by interposing a separating part 50. The separating part 50 is formed by removing the first electrode 11, the photovoltaic conversion layer 12, and the second electrode 13, and exposing the insulating surface of the substrate 1 so that the separating part 50 electrically separates the first group of integrated elements 30 and the second group of integrated elements 40. Directions of series connections in the first group of integrated elements 30 and the second group of integrated elements 40 are opposite in FIG. 3. In the first group of integrated elements 30, the negative is on the right side of the figure and the positive is on the left side of the figure. In the second group of integrated elements 40, the negative is on the left side, and the positive is on the right side.

The first and second groups of integrated elements 30, 40 are electrically connected in series by a connecting wire 6. Electric output is taken out to the external from a pair of positive and negative output terminals 7 arranged on one side of the substrate 1. The connecting wire 6 is formed with, for example, solder plating copper foil. The connecting wire 6 is connected to the first electrode 11a positioned on the left end of the first group of integrated elements 30 and the second electrode 13a on the left side of the second group of integrated elements 40 by solder. An output terminal 7 on the positive side is connected to the first electrode 11b on the right end of the second group of integrated elements 40 and an output terminal 7 on the negative side is connected to the second electrode 13b on the right end of the first group of integrated elements 30 through the lead wire (not shown).

In the above structure, because the two groups of integrated elements 30 and 40 are provided, a higher voltage can be output in comparison with a single group of integrated elements. For example, an operating voltage by one photovoltaic element using amorphous silicon is about 0.6V, and a group of integrated elements formed of one hundred of the photovoltaic elements connected in series can generate output voltage of about 60V.

When two groups of the integrated elements are provided, output voltage of about 120V can be obtained. When the photovoltaic element has a lamination structure having a plurality of pin junctions, operating voltage per single photovoltaic element can increase up to about 2V, and thus the total operating voltage reaches as high as about 200V.

However, when the protective layer 3, the adhesive layer 5, and the rear surface member 4 are provided on a rear surface of the photovoltaic element 2 as shown in FIG. 1, the solar cell module capable of outputting a high voltage does not demonstrate high reliability.

As described above, when a high voltage is accumulated by a single group of integrated elements, a high electric field is applied between the groups of the integrated elements 30, 40. Therefore, when moisture or the like penetrates from a slit or the like into the separating part 50 for separating the groups of integrated elements 30, 40, short circuit occurs, resulting in a great degradation of cell characteristics. Particularly, in the separating part 50 applied high electric field, a generated electric field is far greater than between photovoltaic conversion elements of a conventional solar cell module, and penetration of even a little of moisture can not be ignored.

SUMMARY OF THE INVENTION

This invention was made to solve the above problems and has an objective to provided a reliable solar cell module capable of outputting a high voltage.

A solar cell module of this invention comprises a substrate having an insulating surface, a group of integrated elements including a plurality of photovoltaic elements electrically connected in series on the substrate, a separating part for electrically separating the plurality of the groups of integrated elements arranged in parallel on the substrate, a connecting member for electrically connecting the plurality of the groups of integrated elements in series with each other, rear surface member provided on rear surface sides of the plurality of the groups of integrated elements, and an adhesive layer containing resin for adhering the rear surface member on the rear surface side of the plurality of the groups of integrated elements. The adhesive layer is provided so as to cover the rear surface of the group of integrated elements except for an area corresponding to the separating part.

When adhering the rear surface member on the rear surface of the group of integrated elements by interposing the adhesive layer, the adhesive layer is provided on the rear surface of the group of integrated elements except for the separating part. Therefore, if moisture penetrates into the adhesive layer, leak current between the group of integrated elements through the moisture can be prevented. Thus, a reliable solar cell module capable of outputting a high voltage can be provided.

A groove is formed on the substrate by exposing the insulating surface of the substrate so as to surround the plurality of the groups of integrated elements.

The adhesive layer is formed so as to cover the rear surface of the group of integrated elements except for an area corresponding to the groove.

In the above structure, a groove surrounding the group of integrated elements prevents leak current through the photovoltaic element attached on the side surface of the substrate. When the adhesive layer corresponding to the groove is removed, leak current through moisture can be prevented even when the moisture penetrates in the adhesive layer.

The photovoltaic element comprises an amorphous semiconductor.

A protective layer containing resin is formed on a whole rear surface of the plurality of the groups of integrated elements including the separating part.

A moisture proof member is provided on the protective layer positioned on the separating part.

A moisture proof member is provided on the separating part and the protective layer is provided thereon.

Weatherable insulating member provided on the separating part can protect the separating part which is likely to be short-circuited electrically.

The connecting member comprises a lead wire, and an insulating film is formed between the lead wire and the rear surface of the plurality of the groups of integrated elements.

The insulating film between the rear surface member 4 comprising a metal plate and an output lead can secure the insulation of the rear surface member. Therefore, the insulation with the rear surface member can be secured when using the integrated solar cell panel 1a for outputting high voltage.

A solar cell module comprises a substrate having an insulating surface, a group of integrated elements including a plurality of photovoltaic elements electrically connected in series on the substrate, a separating part for electrically separating the plurality of the groups of integrated elements arranged in parallel on the substrate, a connecting member for electrically connecting the plurality of the groups of integrated elements in series with each other, rear surface member provided on rear surface sides of the plurality of the groups of integrated elements, and an adhesive layer containing resin for adhering the rear surface member on the rear surface side of the plurality of the groups of integrated elements. A width of the separating part located between the adjacent groups of integrated elements is determined depending on a potential difference generated between the adjacent integrated elements which sandwich the separating part.

The separating part is formed by exposing the insulating surface of the substrate.

A width of the separating part satisfies the relational expression $D(\mu m) \geq 3 \times V(V)$ when letting the potential difference be V.

Leak current generated through the separating part can be suppressed by determining a width of the separating part by a potential difference between the photovoltaic elements which are arranged oppositely and interpose the separating part.

The foregoing and other objects, features, aspects and advantages of the present invention will become more apparent from the following detailed description of the present invention when collected conjunction with the accompanying drawings.

DESCRIPTION OF PREFERRED EMBODIMENTS

Figure 1:
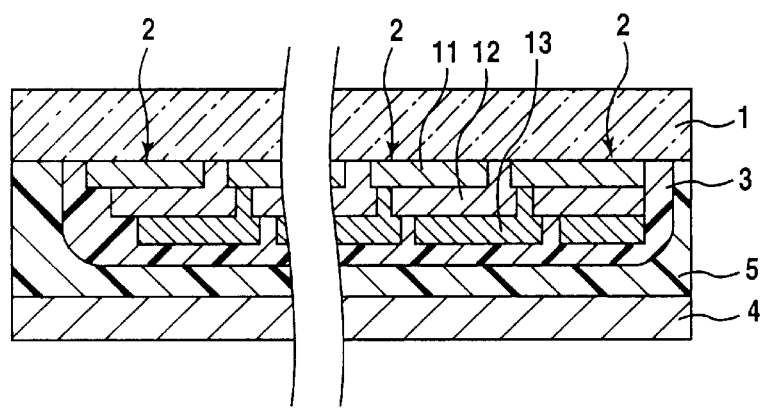
FIG. 1 is a cross sectional view illustrating a structure of a conventional solar cell module using amorphous semiconductor.
Figure 2:
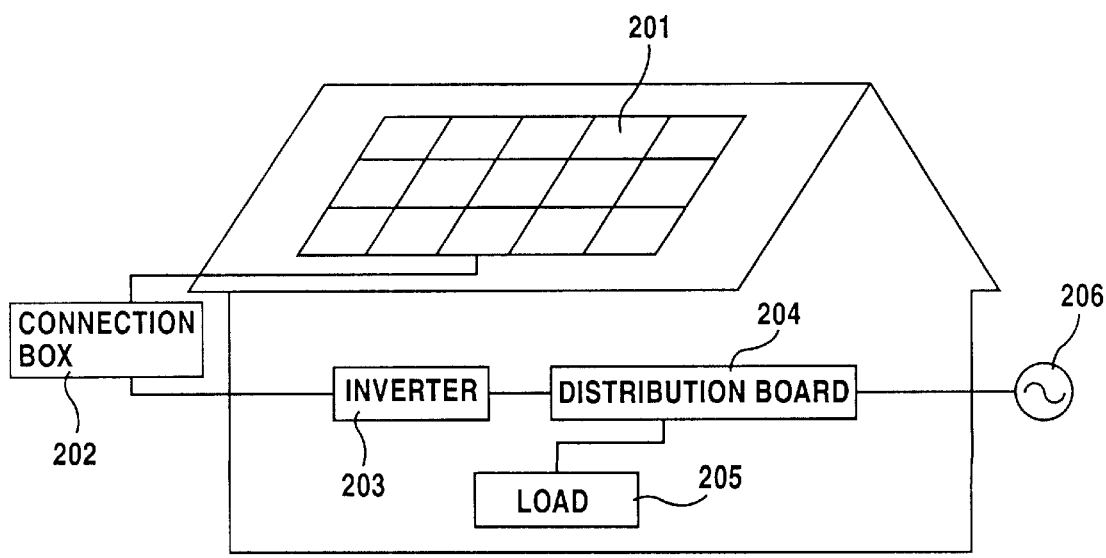
FIG. 2 is a schematic view illustrating a general structure of a domestic solar cell system using the above mentioned solar cell module.
Figure 3:
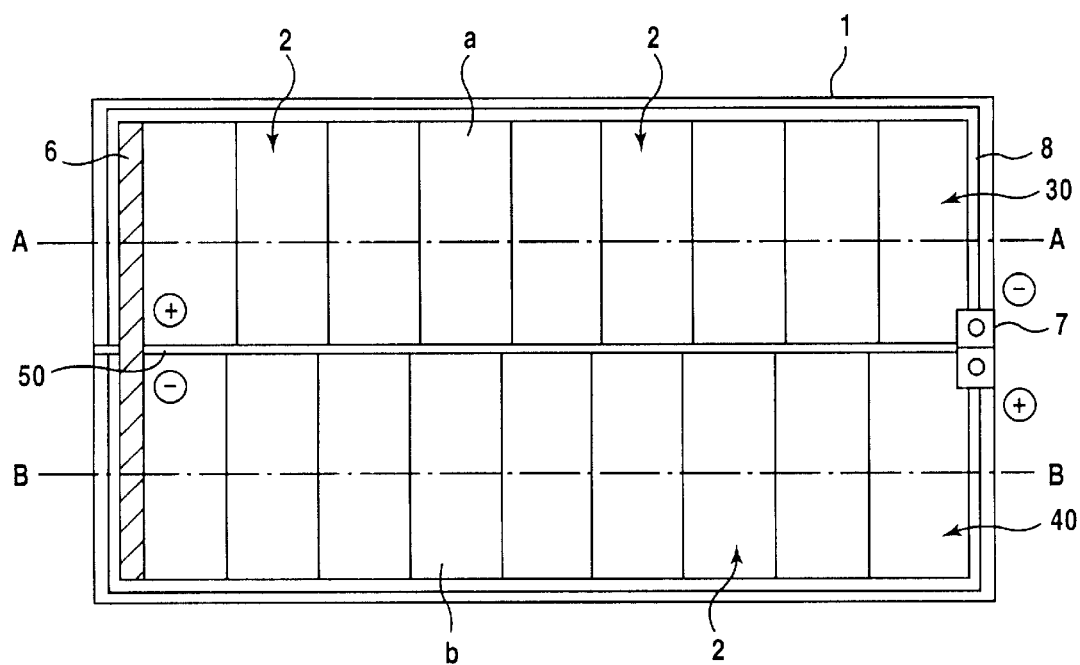
FIG. 3 is a plane view illustrating a solar cell module for high voltage.
Figure 6:
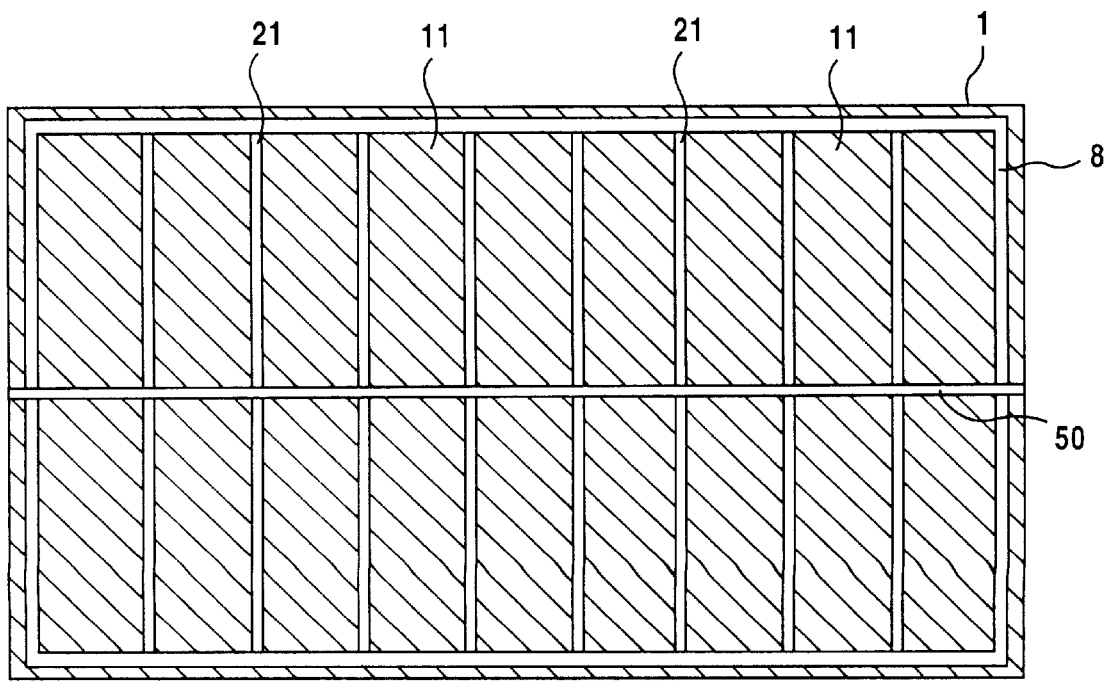
FIG. 6 is a plan view illustrating manufacture processes of the solar cell module in FIG. 3.
Figure 7:
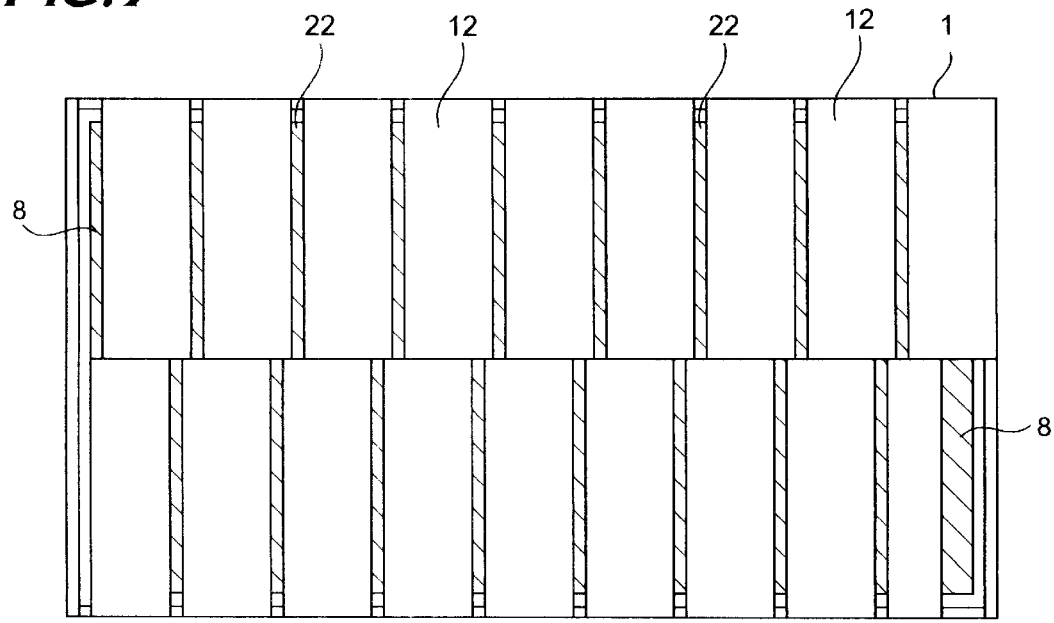
FIG. 7 is a plan view illustrating manufacture processes of the solar cell module in FIG. 3.
Figure 8:
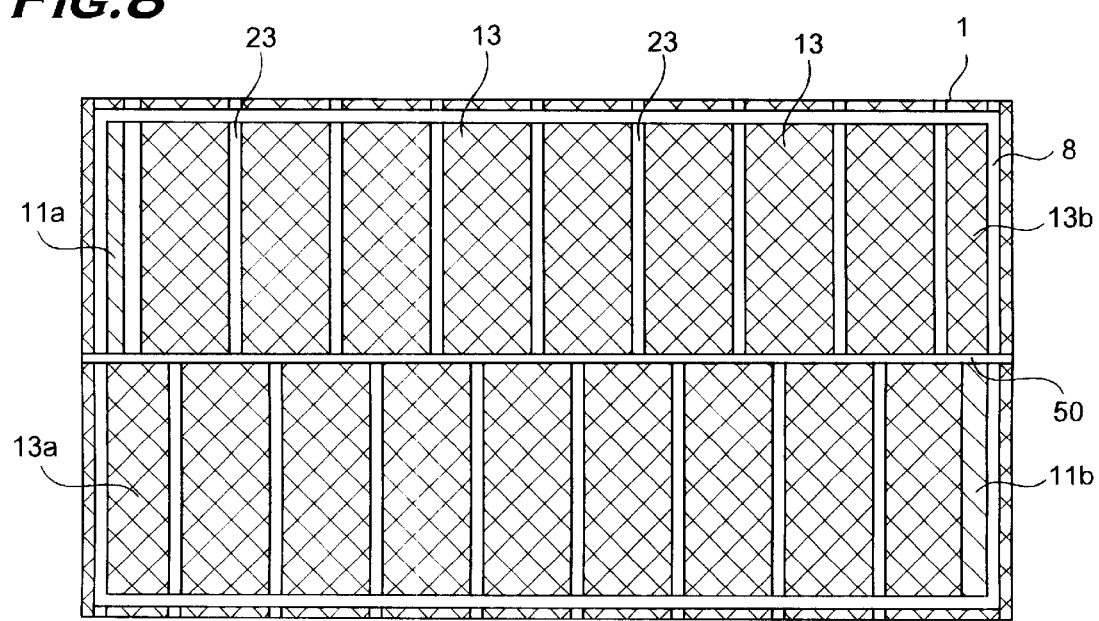
FIG. 8 is a plan view illustrating manufacture processes of the solar cell module in FIG. 3.
Figure 9:
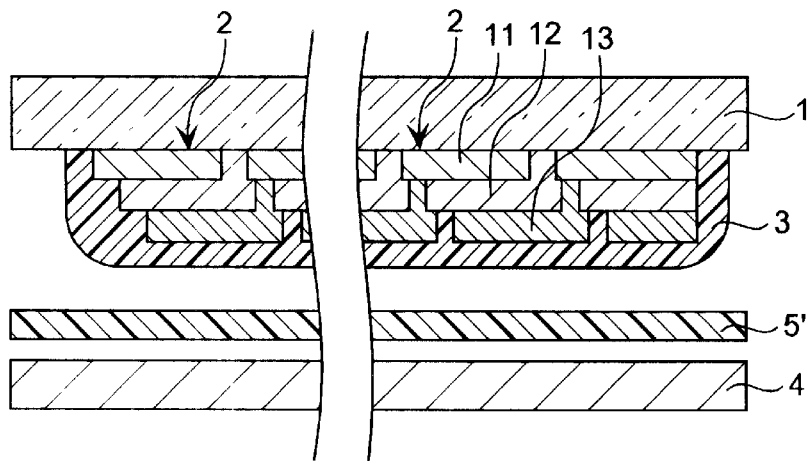
FIG. 9 is a cross-sectional view illustrating manufacture processes of the solar cell module in FIG. 3.

A solar cell module which a rear surface member is adhered on a rear surface by interposing an adhesive layer is produced as shown in FIG. 3. Explanation is made on manufacture processes of the solar cell module by referring to FIGS. 6–9. FIGS. 6–8 are plan views, and FIG. 9 is an exploded sectional view. The same elements having the same function have the same reference numerals shown in FIG. 3.

In processes shown in FIG. 6, a plate of glass of which thickness is 4 mm and which has a 325 mm ×880 mm rectangular shape is prepared as a substrate 1. An $SnO_2$ layer is formed on a whole surface of the substrate 1 by thermal CVD method. YAG laser of about 1.06 $\mu$m wavelength is irradiated to an outer periphery of the $SnO_2$ layer to remove the outer periphery in a frame shape of about 200 $\mu$m width to form a groove 8. The shape to be removed for forming the groove 8 is not necessarily a frame shape, but may be a lattice shape combining four straight grooves parallel to the four sides of the outer periphery of the substrate 1.

The $SnO_2$ layer corresponding to the separating part 50 is removed by an approximately 200 $\mu$m width by YAG laser irradiation, and the $SnO_2$ layer is removed in a line shape by an approximately 50 $\mu$m width at an approximately 8 mm interval in a direction orthogonal with the separating part 50 of 200 $\mu$m by the YAG laser irradiation. The insulating surface of the substrate 1 is exposed to form first electrode separating parts 21 and to form a plurality of the first electrodes 11. In these processes, one hundred of the first electrodes 11 are formed in every one line.

In a process shown in FIG. 7, an amorphous semiconductor layer covering over the first electrode 11 is formed on a whole surface of the substrate 1 by plasma CVD method. The amorphous semiconductor layer is formed by laminating a p-type amorphous silicon carbide layer of approximately 100 Å in thickness, an intrinsic amorphous silicon layer of approximately 1000 Å in thickness, an n-type amorphous silicon layer of approximately 200 Å in thickness, a p-type amorphous silicon layer of approximately 100 Å in thickness, an intrinsic amorphous silicon germanium layer of approximately 1700 Å in thickness, and an n-type amorphous silicon layer of approximately 200 Å in thickness in this order so that a laminated layer is formed. In this composition, operating voltage of approximately 1V can be obtained from a single photovoltaic element.

Second harmonic of YAG laser of 0.53 $\mu$m wavelength parallel to the first electrode separating part 21 is irradiated to the amorphous semiconductor layer on the first electrode 11. The amorphous semiconductor layer is molten and removed so that photovoltaic separating parts 22 and a plurality of photovoltaic converting layers 12 are formed. At that time, laser beam is irradiated to areas corresponding to the first group of integrated elements 30 and the second group of integrated elements 40 by shifting by 50 μm from the first electrode separating parts 21 in opposite directions each other so that the amorphous semiconductor layer is molten and removed.

In processes shown in FIG. 8, an Ag layer is formed on a whole surface of the substrate 1 covering the photovoltaic conversion layer 12 by sputtering. The Ag layer is buried in the photovoltaic conversion layer separating part 22 and is made contact with the first electrode 11. In the separating part 50 and a groove 8 formed by removing the $SnO_2$ layer, a laser beam is irradiated to the Ag layer and the Ag layer and the photovoltaic conversion layer 12 on the grooves are completely removed so as to expose the insulating surface of the substrate 1. In eliminating the Ag layer and the photovoltaic conversion layer on the groove 8, a shape to be removed is not necessarily a frame shape, but it may be a shape of a groove parallel only to a series connection direction (right and left directions of the figure). In this embodiment, YAG laser is used for removing an area corresponding to the groove 8, and a second harmonic of the YAG laser is used for removing an area corresponding to the separating part 50.

Second harmonic of YAG laser parallel to the photovoltaic converting layer separating part 22 is irradiated to the Ag layer on the photovoltaic converting layer 12 so that the Ag layer is molten and removed in a line shape so that second electrode separating parts 23 and a plurality of second electrodes 13 are formed. At that time, the laser beam is irradiated to areas corresponding to the first group of integrated elements 30 and the second group of integrated elements 40 by shifting by 50 μm from the photovoltaic converting layer separating part 22 in opposite directions each other, and the Ag layer is melt and removed.

Figure 4:
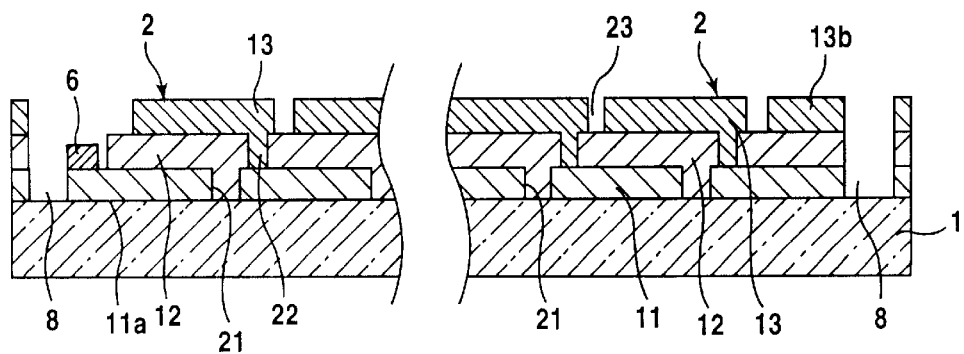
FIG. 4 is a cross-sectional view along the A—A line in FIG. 3.
Figure 5:
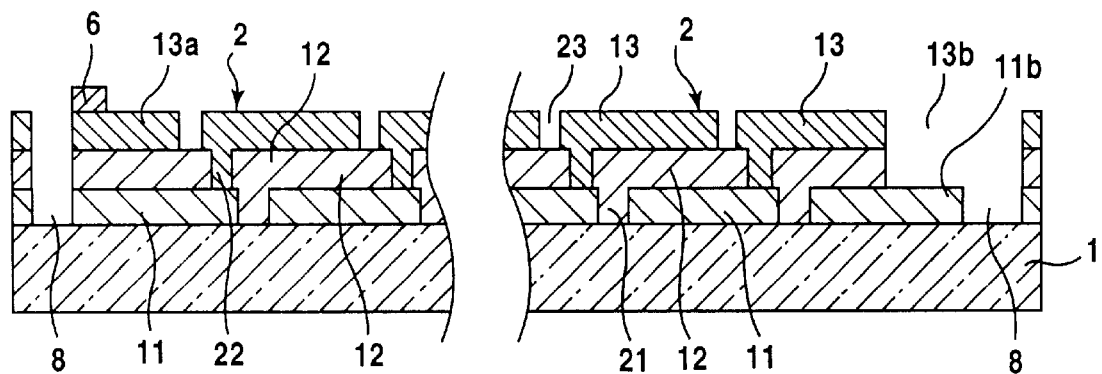
FIG. 5 is a cross-sectional view along the B—B line in FIG. 3.

As shown in FIGS. 4, 5, a first electrode 11a positioned on a left end of the first group of integrated elements 30 and a second electrode 13a positioned on a left end of the second group of integrated elements 40 are connected by a connecting wire 6 of soldering copper foil. The connecting wire 6 as a connector electrode may be formed by a printed electrode or the like using conductive resin.

In a process of FIG. 9, a protective layer 3 is formed by coating epoxy resin by printing so as to cover surfaces of the plurality of photovoltaic elements. The protective layer 3 is formed by screen-printing to apply epoxy resin paste such as "Pelcoat XC-2045-7" of Nippon Pelnox Corporation and burning at a temperature of 130–150° C. By these processes, the protective layer 3 of excellent moisture and water proofness of 10–20 μm in thickness is formed. A rear surface member 4 formed of plastic is laminated on the protective layer 3 by interposing a thermal plastic resin sheet 5' such as EVA sheet, and the rear surface member 4 is adhered on a rear surface of the protective layer 3 by vacuum thermo compression bonding.

When measuring the photovoltaic conversion property before and after the solar cell module manufactured according to the above processes is allowed to stand under an atmosphere of 85° C. and 93% humidity for 1000 hours, the property degrade from 15% to 20%.

The inventers have examined the reason of the degraded photovoltaic conversion property, and reached the following conclusion.

The first and second groups of integrated elements 30, 40 comprise (n) units of photovoltaic elements 2. When the (k)th photovoltaic element from a right side of the first group of integrated elements 30 is taken as (a), (n–k) units of photovoltaic elements are arranged on a left side of the photovoltaic element (a). When a photovoltaic element, which is adjacent to the photovoltaic element (a) and interposes the separating part 50 with the element (a) is taken as (b), (n–k) units of photovoltaic elements comprising the second group of integrated elements area arranged on a left side of the element (b). And, when a voltage of a single photovoltaic element is taken as (v), a potential difference between the photovoltaic elements (a), (b) is 2(n–k)v. Therefore, a potential difference 2(n–k) times as great as that of a single element is generated between the elements (a), (b).

As described above, an operating voltage of a tandem lamination type photovoltaic element comprising amorphous semiconductor is approximately 1V, and a potential difference between adjacent photovoltaic elements 2, 2 is as small as 1V. However, when a plurality of groups of integrated elements are arranged in parallel for outputting a high voltage, a greater potential difference as compared with a conventional one is generated between the groups of integrated elements.

For example, when the first and second groups of integrated elements 30, 40 respectively include 100 units of photovoltaic elements, a potential difference between the $50^{th}$ photovoltaic element from a right side of the groups of integrated elements 30, 40 is 2(100–50)×1=100V. When an operating voltage of a solar cell module is 200V, a potential difference between the photovoltaic elements on right ends of the first and second groups of integrated elements 30, 40 is 200V.

The adhesive layer 5 prevents moisture from penetrating from the external as well as adheres the rear surface member 4. Therefore, thermal plastic water-proof resin such as EVA is used as the adhesive layer 5.

While the adhesive layer 5 comprising waterproof resin prevents moisture from penetrating, once moisture penetrates inside, it is difficult to expel the moisture outside. Furthermore, a greater potential difference is generated when using a solar cell module provided with a plurality groups of integrated elements for outputting a higher voltage as compared with a conventional one. As a result, when moisture, even a small amount, penetrates in the adhesive layer 5 and moves to a place corresponding to the separating part 50 for separating the groups of integrated elements, a potential difference between the groups of integrated elements is far greater than a conventional case, thus leak current through the moisture is generated and the photovoltaic property is degraded.

In this invention, an adhesive layer is provided so as to cover a rear surface of the group of integrated elements except for areas corresponding to the separating parts 50.

Figure 10A:
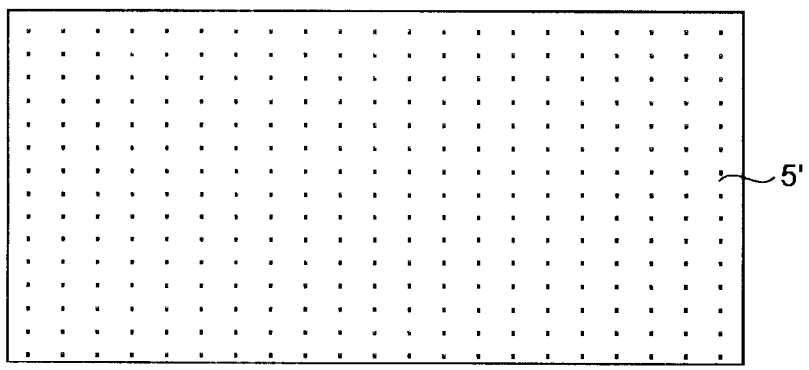
FIG. 10A is a plane view of an adhesive sheet.
Figure 10B:
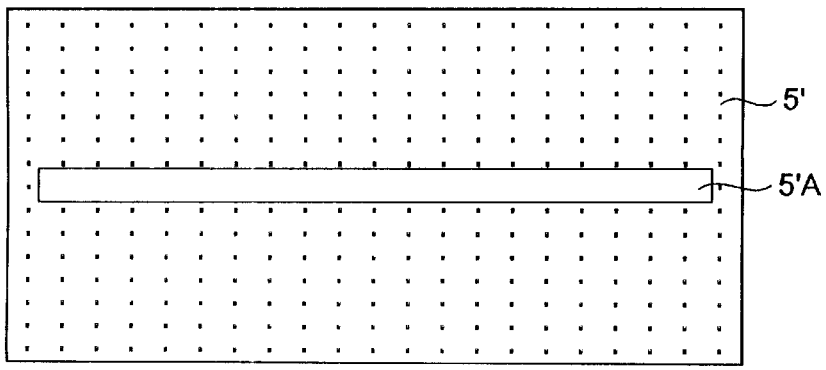
FIG. 10B is a plane view of the adhesive sheet used in this invention.

Two kinds of sheets illustrated in plan views of FIGS. 10A, 10B are prepared as adhesive sheets 5' for lying on the protective layer 3. The sheet in FIG. 10A is a general square shape adhesive sheet, and the sheet in FIG. 10B is one which an area 5'A which corresponds to the separating part 50 and is little larger than the separating part 50 is removed. A solar cell module using the adhesive sheet of FIG. 10A as a comparative example and a solar cell module using the adhesive sheet of FIG. 10B of the first embodiment are produced. They are allowed to stand in an atmosphere of high temperature 80° C. and 80% humidity for 500 hours, 1000 hours, and 2000 hours, and the photovoltaic conversion property is measured. The result is shown in Table 1. The value of conversion efficiency of after is indicated by a relative value to the conversion efficiency of before (initial property).

TABLE 1

|  | After 500 hours | After 1000 hours | After 2000 hours |
|---|---|---|---|
| 1st embodiment | 1.01 | 0.99 | 0.92 |
| Comparative Example | 0.92 | 0.88 | 0.80 |

As indicated in Table 1, the longer the module as the comparative example is allowed to stand, the more the photovoltaic conversion efficiency is lowered. After the module is allowed to stand for 2000 hours, the conversion efficiency is deteriorated as low as 80% of the initial property, resulting in a degraded reliability. On the other hand, even after the module is allowed to stand in the atmosphere of high temperature and humidity for 2000 hours, the conversion efficiency is lowered only to 92% of the initial property, indicating that the reliability of the module of the first embodiment is improved.

Because the adhesive layer 5 does not exist in an area corresponding to the separating part 50, leak current between the groups of integrated elements 30, 40 through the moisture is prevented, even when moisture penetrates into the adhesive layer 5. Thus the reliability of the solar cell module of the first embodiment is improved.

Figure 11:
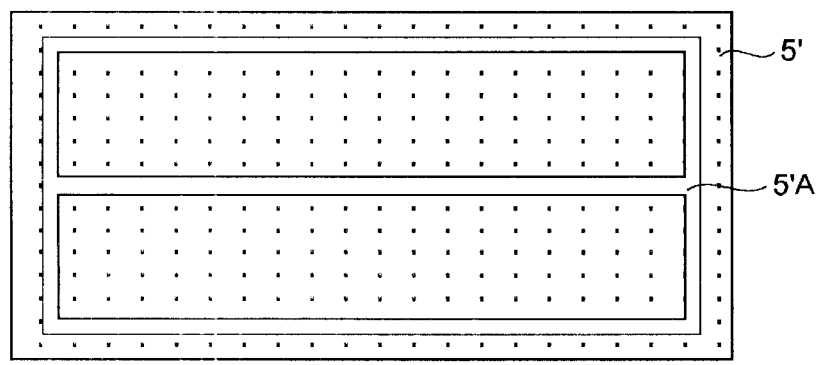
FIG. 11 is a plane view of another adhesive sheet.

A groove 8 is provided so that the groups of integrated elements 30, 40 are surrounded. The groove 8 prevents leak current from occurring through the first electrode, the photovoltaic conversion layer, and the second electrode attached on a side surface of the substrate 1. However, when moisture penetrates the adhesive layer 5 in an area corresponding to the groove 8, leak current through the moisture is possible to occur. In conjunction with this, a solar cell module of the second embodiment is produced by using the adhesive sheet of a shape illustrated in the plan view of FIG. 11. As shown in FIG. 11, the sheet is one which an area 5'A, which corresponds to the separating part 50 and the groove 8 and is larger than the separating part 50 and the groove 8, is removed. The solar cell modules of the second embodiment is allowed to stand in an atmosphere of high temperature of 80° C. and 80% humidity for 500 hours, 1000 hours, and 2000 hours, and the photovoltaic conversion property is measured. The result is shown in Table 2. A value of conversion efficiency of after is indicated by a relative value to the conversion efficiency of before (initial property).

TABLE 2

|  | After 500 hours | After 1000 hours | After 2000 hours |
|---|---|---|---|
| 2nd embodiment | 1.01 | 1.00 | 1.00 |

As indicated in Table 2, the solar cell module of the second embodiment can obtain conversion efficiency approximately equal to the initial one even after standing in the high temperature and moisture atmosphere for 2000 hours, and the reliability of the module is improved.

As described above, the high voltage solar cell module of this invention for outputting a high voltage as compared with a conventional one includes a plurality of groups of integrated elements arranged in parallel by interposing a separating part and electrically connected in series. The adhesive layer is provided on the groups of integrated elements after removing the separating part when a rear surface member is adhered on the rear surface of the groups of integrated elements by interposing the adhesive layer. Therefore, even when moisture penetrates the adhesive layer, occurrence of leak current between the groups of integrated element through the moisture is prevented. Thus, a highly reliable solar cell module for outputting a high voltage is provided.

This invention is not limited to a constitution described in the above embodiment. In the above embodiment, two groups of integrate elements comprising a plurality of photovoltaic elements electrically connected in series are provided on a substrate having an insulating surface. The invention can be applied to not less than three groups of integrated elements.

Figure 12:
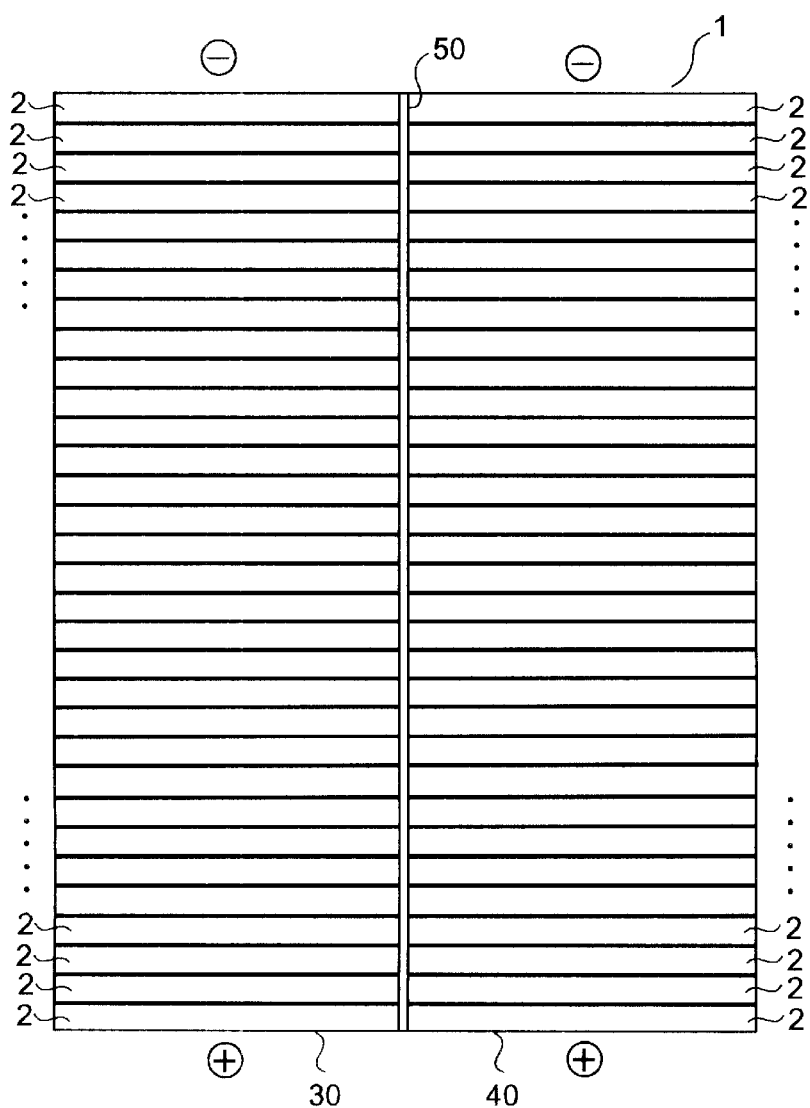
FIG. 12 is a plane view of another solar cell module for high voltage.
Figure 13:
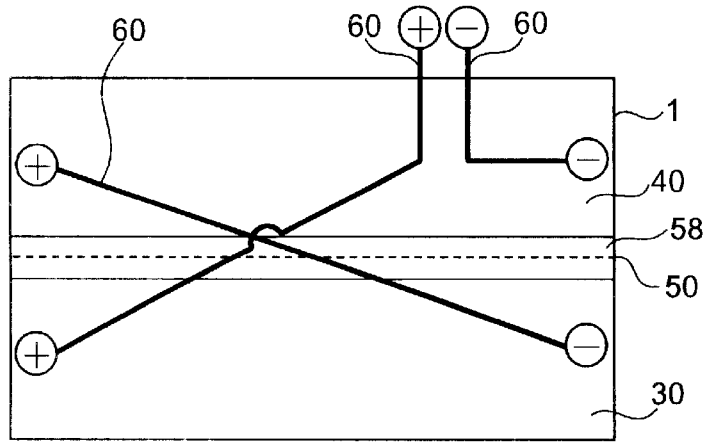
FIG. 13 is a schematic view illustrating a connection of lead wires of the solar cell module of the present invention.
Figure 14:
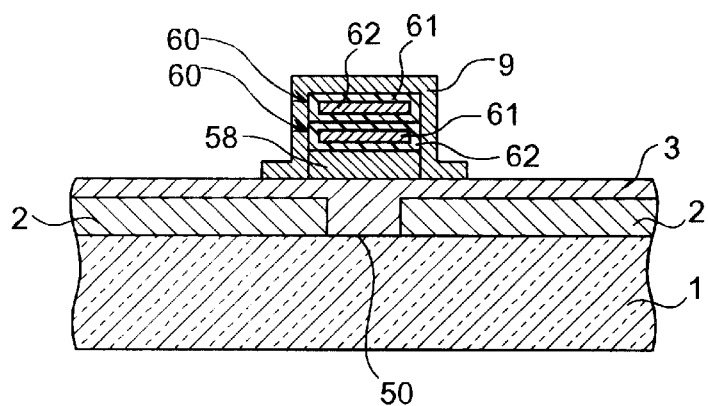
FIG. 14 is a fragmentary sectional view illustrating the solar cell module of FIG. 13.

Although a pair of positive and negative output terminals are provided on the same side in the above embodiment, the pair of positive and negative output terminals may be provided on two sides as shown in FIG. 12. When output terminals of the pair are provided on the opposite two sides, the groups of integrated elements are connected in series by rear surface wiring as shown in FIGS. 13 and 14.

Rear surface wirings are provided by connecting lead wires 60 of such as copper foil with the positive and negative electrodes, laying the lead wires 60 on the protective layer 3 provided on the rear surface electrode layer, and connecting with the groups of integrated elements 30, 40. When the pair of positive and negative output terminals are provided on the opposite two sides and the groups of integrated elements are connected in series by the rear surface wirings, the structure to be formed is not one that the positive and negative terminals between the groups of integrated elements are connected on one end as shown in FIG. 13. In the structure shown in FIG. 3, the groups of integrated elements are connected by a connecting wire 6 at ends on one side, and the direction of series connection in the first and second groups of integrated elements 30, 40 are opposite. Areas corresponding to the first and second groups of integrated elements 30, 40 are separated by shifting by 50 µm in opposite directions respectively.

When the groups of integrated elements are connected in series with the pair of positive and negative output terminals provided on the opposite two sides by a rear surface wiring as shown in FIG. 12, areas corresponding to the first and second groups of integrated elements 30, 40 are not shifted to separate but are irradiated with laser of the same line so as to separate each other.

In the embodiment of FIG. 12, the groups of integrated elements of 100V 30, 40 are connected by a lead wire and 200V voltage output is obtained from a single solar cell module.

As described above, the protective layers 3 are formed on a plurality of photovoltaic elements 2 for purposes of waterproofing and moisture proofing. In the embodiment shown in FIG. 12, the protective layers 3 are removed at predetermined places of both ends of the respective group of integrated elements 30, 40 so as to expose positive and negative takeout electrodes.

This embodiment is structured so that the groups of integrated elements 30, 40 respectively output a voltage of 100V, and a high voltage is applied to the separating part 50 not as like the separating part between the photovoltaic elements 2, 2. By the way, when the solar cell module is used for a house, the solar cell module is used as a roof material. In this case, the rear surface member 4 such as a metal plate is adhered to a rear surface side of the protective layer 3 by interposing the adhesive layer 5 such as ethylene vinyl acetate (EVA) so as to reinforce the rear surface member 4 and improve fire resistance.

When the separating part 50 is scratched at a time of adhering the rear surface member 4, moisture penetrates from that scratch and a short circuit caused by a high electric field is likely to occur. As described above, the separating part 50 is wider than the separating part between the photovoltaic elements 2, 2 in order to ensure electrical separation. Therefore, a step between the groups of the integrated elements 30, 40 is generated and the protective layer 3 is not sufficiently coated, causing moisture to penetrate.

Weatherable insulating coating material is provided on the separating part 50 so as to improve the moisture proofness of the separating part 50 in this embodiment. As the coating material, polyester film, polyphenylene sulfide film, polyimide film, polyvinyl chloride film, polycarbonate, polyphenylene oxide, polysulfone, polyethersulfone or the like may be used.

Weatherable insulating tape 58 containing polyester film, for example, among the above materials is prepared. The weatherable insulating tape 58 covers the separating part 50 on the protective layer 3. The coating of the separating part 50 with the weatherable insulating tape 58 prevents moisture from penetrating the separating part 50.

For example, the negative takeout electrode of the group of integrated elements 30 and the positive takeout electrode of the group of integrated elements 40 are connected in series by using the lead wire 60 of insulating coating copper foil.

Figure 17:
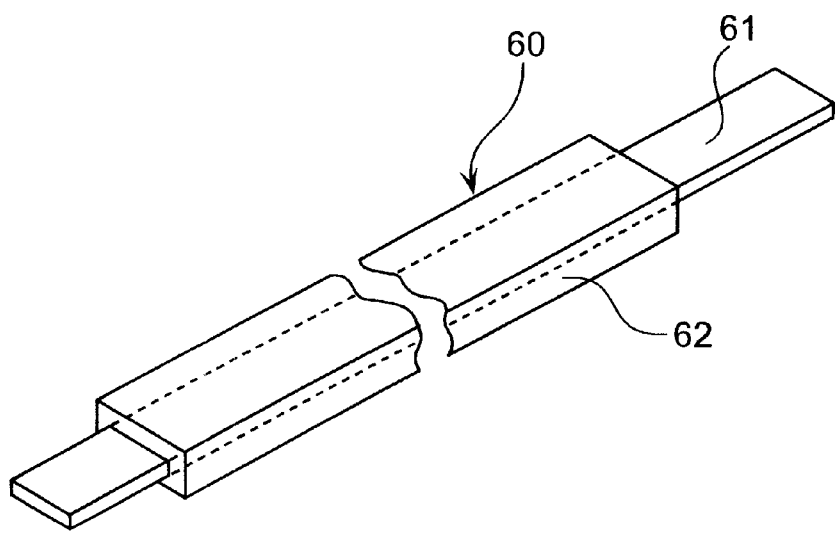
FIG. 17 is a perspective view illustrating one example of lead wires used in this invention.

As shown in FIG. 17, the lead wire 60 is formed by sandwiching a soldered rectangular copper wire 61 with an insulating film 62 of which base material is polyphenylene sulfide film.

In FIG. 13, the negative takeout electrode of the group of integrated elements 30 and the positive takeout electrode of the group of integrated elements 40 are connected with the lead wire 60 arranged diagonally.

The lead wire 60 from the solar cell module is led through from an end of the one group of integrated elements 40 as shown in FIG. 13. The lead wire 60 connected with the positive takeout electrode of the other group of integrated elements 30 crosses with the lead wire 60 connected in series at a certain place. Insulation between the lead wires 60 can be secured by using a lead wire of insulating coating copper foil as the lead wire 60 which is connected with the positive electrode.

As the lead wire 60 crosses on the middle place or on the separating part 50, the separating part 50 on which the lead wire 60 crosses is coated by a weatherable insulating tape 9 after laying the lead wire 60, so as to improve the weatherability of the separating part 50.

The lead wire 60 formed with insulating coating copper foil is connected from the negative takeout electrode of the one group of integrated elements 40 so that the lead wire 60 is taken out to the external.

The lead wire 60 for connection may be provided with adhesive on the rear surface so as to be fixed on the protective layer 3, or may be fixed by a moisture proof sheet after laying the lead wire 60 for connection.

Figure 15:
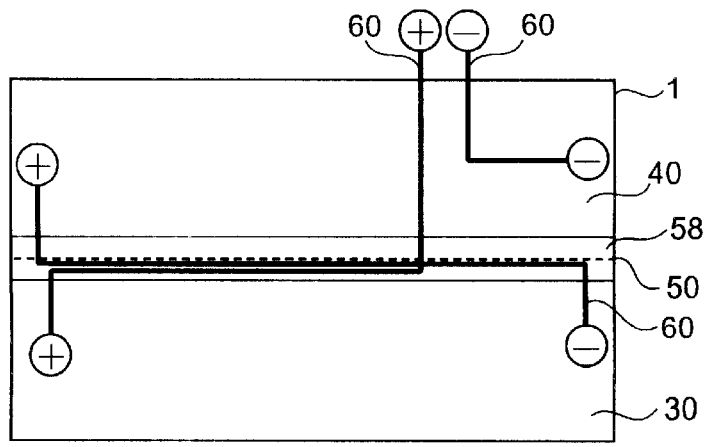
FIG. 15 is a schematic view illustrating another example of a connection of lead wires of the solar cell module of this invention.

In FIG. 15, the lead wire 60 of insulating coating copper foil for series connection is laid along the separating part 50, and other lead wire 60 is also arranged along the separating part 50. The lead wires are taken out to the external from predetermined places. The weatherable insulating tape 58 is attached on the separating part 50 divided into two by the lead wires 60 and covers over the separating part 50 including the lead wires 60. In this structure, the lead wire 60 can be adhered and the weatherability of the separating part 50 is improved.

Figure 16:
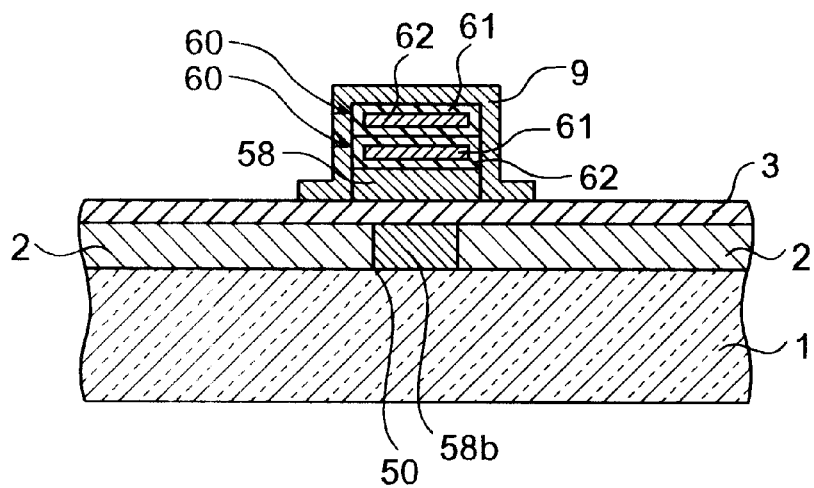
FIG. 16 is a fragmentary sectional view illustrating a lead wire in another embodiment of this invention.

In FIG. 16, weatherable insulating material 8b formed with butyl rubber and polyester or the like is filled in the separating part 50 in order to improve the weatherability and insulation of the separating part 50, and then the protective layer 3 is formed, and the lead wire 60 for connection is provided. Furthermore, the lead wire 60 for connection is laid along the separating part 50 and the weatherable insulating tape 9 is provided on the protective layer 3 on the separating part 50. The weatherable insulating material 8b and the weatherable insulating tape 9 both improve the weatherability.

The center part of the separating part which is found to be subject to electrical short circuit in moisture proof testing can be protected by forming a weatherable insulating material, a lead wire for connection, and a weatherable insulating tape in this order.

In FIG. 16, two of the weatherable insulating tapes 8, 9 are provided. In other case, the weatherability of the separating part 50 can be secured by the weatherable insulating member 8b even when the tapes 58, 9 are omitted.

The center part of the separating part which is found to be subject to electrical short circuit in moisture proof testing can be protected by arranging weatherable insulating material in the center of the separating part.

Figure 18:
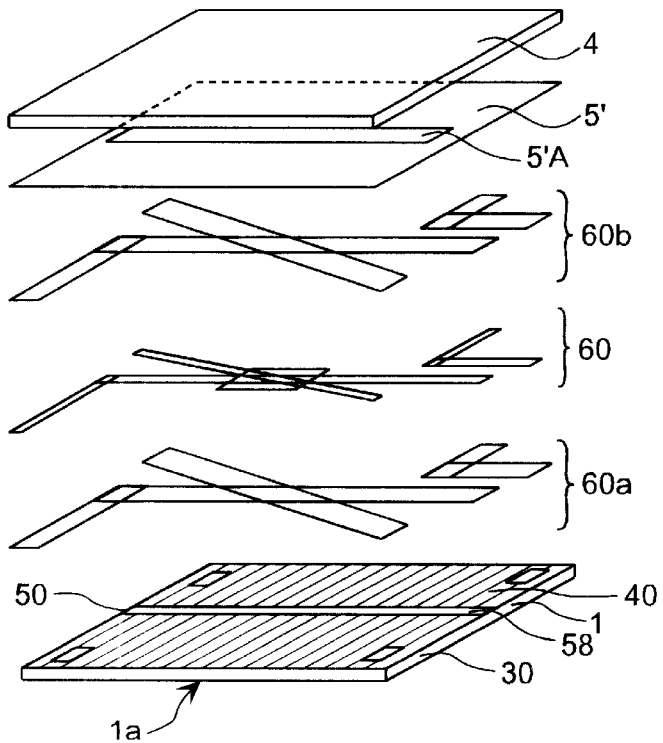
FIG. 18 is an exploded perspective view of the solar cell module of this invention.

By referring to FIG. 18, explanation is made on processes for connecting the rear surface member 4 on the protective layer 3 by interposing the adhesive layer 5' of the solar cell module illustrated in FIGS. 12–16. In FIG. 18, an insulating tape 60a is adhered on a solar cell panel 1a having groups of integrated elements 30, 40 in which a plurality of photovoltaic element are connected in series on a glass substrate 1 by corresponding to wiring position. Areas of the protective layer 3 corresponding to the separating part 50 of the groups of integrated elements 30, 40 are coated with a weatherable insulating tape 58. The lead wire 60 containing copper foil or the like is laid on the insulating tape 60a, and connects the groups of integrated elements 30, 40 in series with each other. Then, the lead wire 60 is drawn out to the external. An insulating tape 60b is overlapped on the lead wire 60. The rear surface material 4 comprising a metal plate is adhered by the adhesive sheet 5' in which an area which is a little larger than the area 5A' corresponding to the separating part 50 is removed. Through these processes a solar cell module can be obtained.

Because the adhesive layer is not formed on an area corresponding to the separating part 50, occurrence of leak current between the groups of integrated elements 30, 40 through moisture can be prevented even when the moisture penetrates the adhesive layer 5'. The weatherable insulating material 58 laid on the separating part 50 can prevent the penetration of moisture into the separating part 50 which is applied a high voltage, thus a short circuit at the separating part 50 can be securely prevented.

Figure 19:
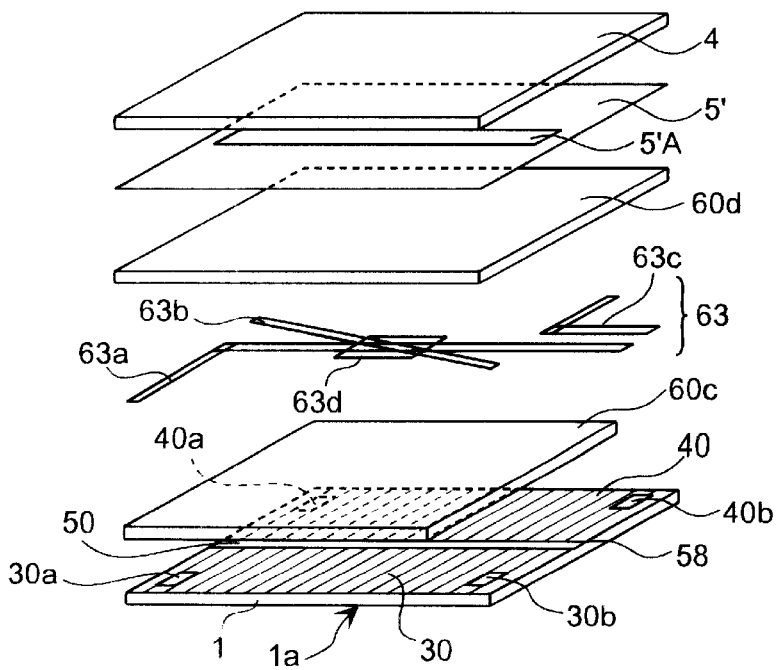
FIG. 19 is an exploded perspective view of another solar cell module of this invention.
Figure 20:
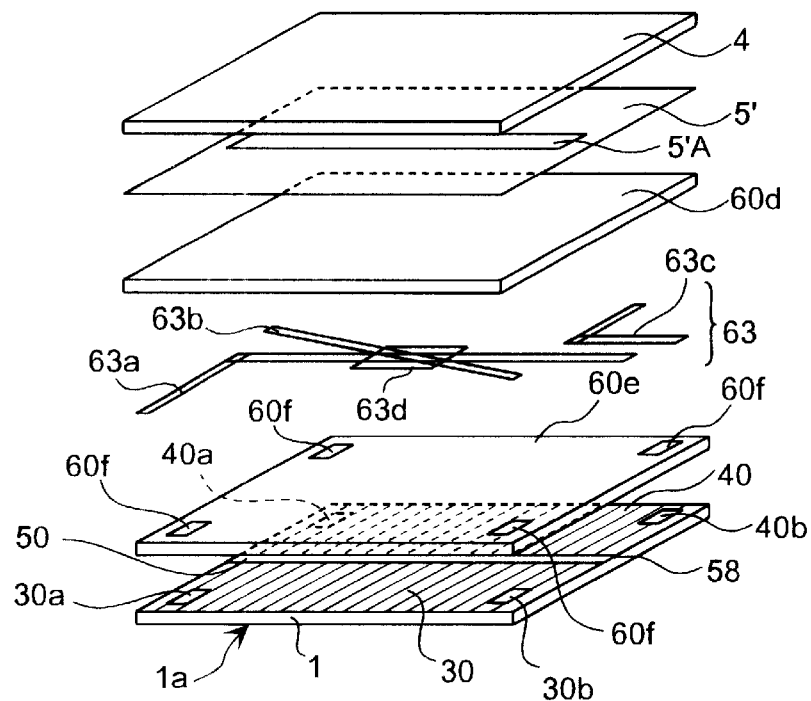
FIG. 20 is an exploded perspective view of another solar cell module of this invention.
Figure 21:
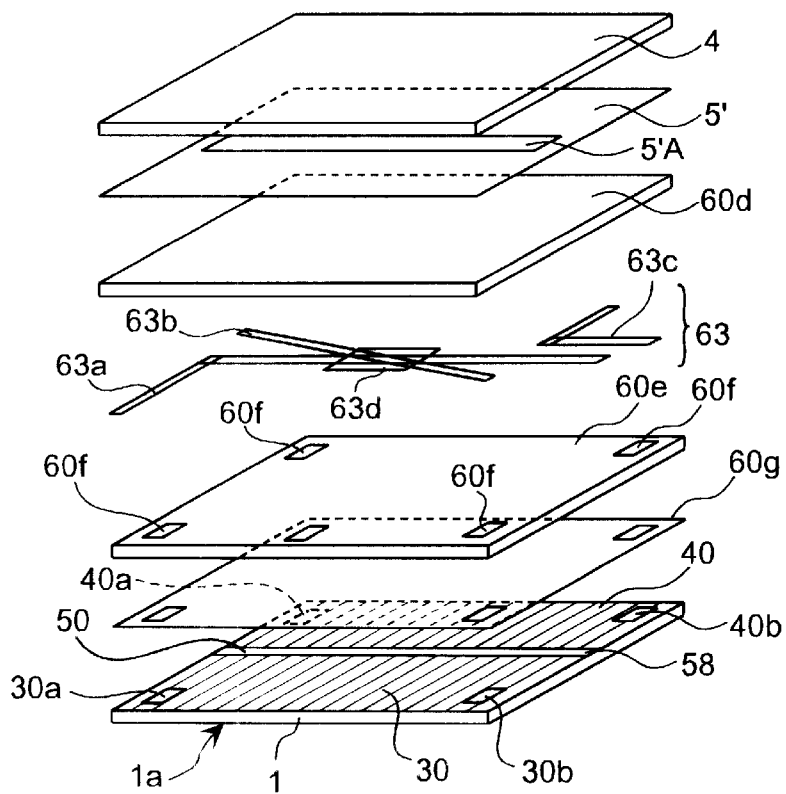
FIG. 21 is an exploded perspective view of another solar cell module of this invention.

The above described solar cell module requires an operation for adhering the insulating tape. FIGS. 19–21 describe a solar cell module integrated with lumbers which is easy to manufacture and is reliable.

Instead of the insulating tape, an insulating film 60c which coats the whole surface of the rear surface electrode side of the solar cell panel 1a may be laminated on the solar cell panel 1a on which the two groups of integrated elements 30, 40 are provided. The operationality in laminating the film 60c can be improved when the size of the insulating film 60c is not as large as a size for covering the output terminal takeout electrodes 30a, 30b, 40a, and 40b of the solar cell panel 1a.

Then, wiring for connecting the two groups of integrated elements 30, 40 of the solar cell panel 1a in series by an output lead 63, and wiring for taking out an output to the external are conducted. The output lead 63 containing copper foil or the like comprises three of output leads 63a, 63b, and 63c; the output lead 63a for taking out an output from the positive takeout electrode 30a of the group of integrated elements 30 to the external, the output lead 63b for connecting the negative takeout electrode 30b of the group of integrated elements 30 and the positive takeout electrode 40a of the group of the integrated elements 40, and the output lead 63c for taking out an output from the negative takeout electrode 40b of the group of the integrated elements 40.

The output lead 63 from the solar cell panel 1a is led through from one end as shown in FIG. 19. Thus, the output lead wire 63a for connecting with the positive takeout electrode 30a of the group of integrated elements 30 crosses on the output lead wire 63b for connecting the groups of integrated elements 30, 40 in series. The cross part is insulated by using the insulating tape in advance.

Then, an insulating film 60d, an adhesive layer 5' containing EVA sheet, and a rear surface member 4 comprising a metal plate are laminated on the output lead 63 in this order, and is integrated by applying thermo compression under low pressure, then a solar cell module is finished.

The rear surface member 4 is formed with a colored zinc metal plate and a stainless plate or the like and the surface is insulated. Because insulation is secured by the insulating film, the insulation of the surface of the rear surface member may be minimum.

The insulating films 60a, 60c may be formed with polyester film, polyphenylene sulfide film, polyimide film, polyvinyl chloride film, polycarbonate, polyphenylene oxide, polysulfone, polyethersulfone or the like.

Adhesive is applied on one surface of the insulating film 60a so that the insulating film 60a is adhered on a side of the solar cell panel 1a. Thus a shift of a position of the insulating film 60a at a time of integrating each other can be prevented.

It is preferred that the insulating film 60d covers the whole output lead 63 to be wired.

In this structure, the insulating film 60d for coating the whole output lead 63 is provided between the rear surface member 4 of a metal plate and the output lead 63, and thus the insulation between the rear surface member 4 and the output lead can be secured. Thus, the insulation between the rear surface member 4 and the output lead 63 can be secured when the integrated solar cell panel 1a for outputting a high voltage is used. Furthermore, the insulating film 60c on a surface of the solar cell panel 1a can prevent a short circuit between the output lead 63 and the solar cell panel 1a.

Explanation on another embodiment is made according to FIG. 20. The elements having the same functions as shown in FIG. 19 are indicated by the same reference numerals, and explanation on them is omitted.

In FIG. 20, a removed part 60f of the output terminal takeout part is provided on the insulating film 60e between the solar cell panel 1a and the output lead 63. As like the insulating film 60c, the insulating film 60e is applied adhesive on one surface, and the size of the insulating film 60e is preferably as large as the solar cell panel 1a or at least as large as a size for covering the output terminal takeout part.

Explanation on another embodiment is made according to FIG. 21. The elements having the same functions as in FIG. 20 are indicated by the same reference numerals and explanation on them is omitted.

In FIG. 21, an adhesive sheet 60g and an insulating film 60e are integrally laminated between the solar cell panel 1a and the output lead 63. The insulating film 60e is integrated by the adhesive sheet 60g and adhesive is not necessary. The insulating film 60e is as large as the solar cell panel 1a or at least a little larger than the output terminal takeout part. Also the adhesive sheet 60g is preferably the same size as the insulating film 60e.

The operationality can be improved by changing from the insulating tape to the insulating film in the solar cell module of this invention. The invention also prevents a position shift of the output lead and improves insulation performance. Therefore, the invention provides a solar cell module capable of reducing cost, improving the yields, and having high reliability and insulation performance.

Explanation is made on an example that the solar cell module is used as a roof fabric.

Figure 22:
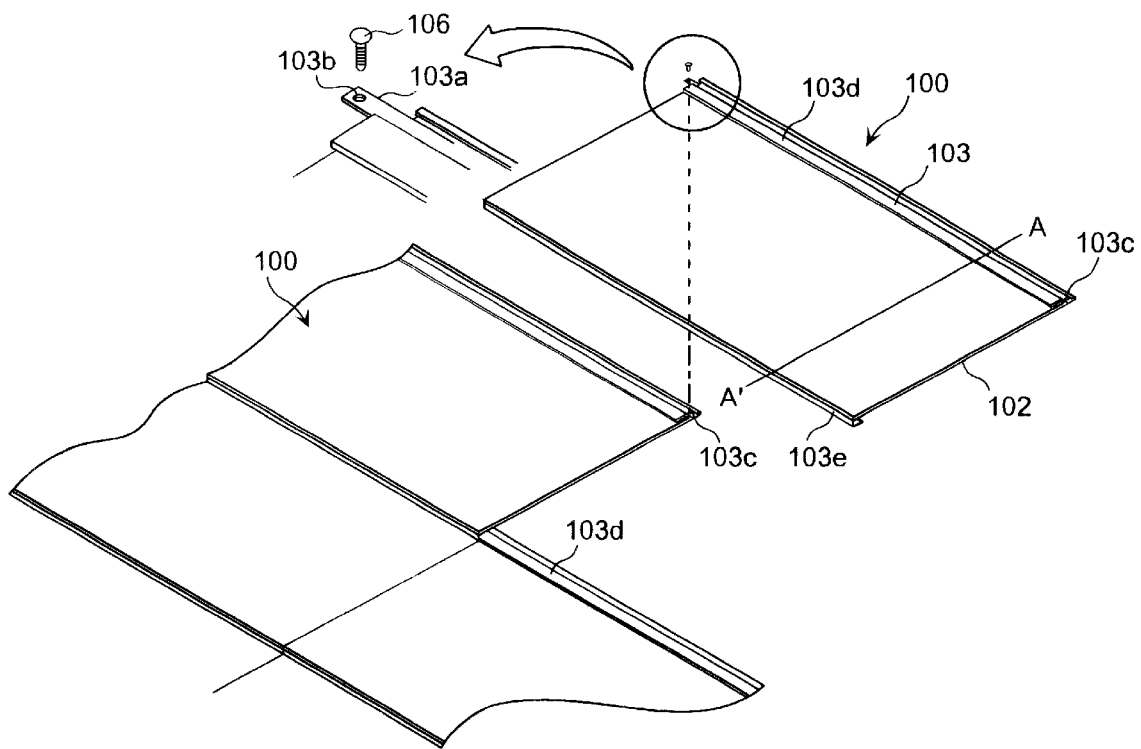
FIG. 22 is a perspective view illustrating one example of arrangement of a plurality of the solar cell modules of this invention.
Figure 23:
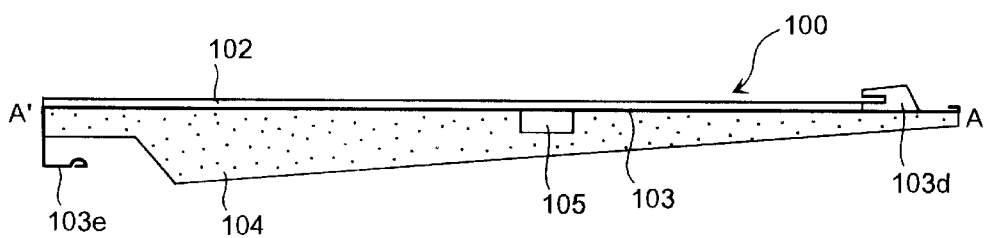
FIG. 23 is a cross sectional view along A–A' line of FIG. 22.

FIG. 22 is a perspective view illustrating one example of arrangement of the solar cell modules of this invention. FIG. 23 is a cross sectional view of the solar cell module along A–A' line indicated in FIG. 22.

A solar cell module 100 includes a group of integrated elements 102 comprising photovoltaic elements arranged in series. The photovoltaic element is formed by laminating, for example, a rear surface electrode, a photoactive layer, and a front surface electrode. The group of integrated elements 102 is integrated with a rear surface plate 103 of a steel plate by interposing an adhesive layer of such as EVA as described above. Backing 104 of foam agent is provided on a rear surface of the rear surface plate 103, and a terminal box 105 for collecting electric power generated by the group of integrated elements 102 is provided in a space on a back side of the rear surface plate 103. Lead wire (not shown) for taking out the electric power to an inverter and a capacitor is drawn from the terminal box 105.

A protrusion 103a is formed on one of upper ends of the rear surface plate 103, and a hole 103b for inserting a screw is formed in the protrusion 103a. When a plurality of solar cell modules 100 are arranged, the protrusion 103a is made contact with the rear surface plates 103 of one of the solar cell modules 100 adjacent in right and left directions. On the other of upper ends of the rear surface plate 103, a hole 103c for inserting a screw is formed so as to correspond to the hole 103b of the protrusion 103a of the adjacent solar cell module 100. When a plurality of solar cell modules 100 are arranged, the adjacent solar cell modules 100, 100 are fixed by inserting the screw 106 into the holes 103b and 103c. Thus the solar cell modules 100, 100 are electrically connected.

Engaging parts 103d, 103e having different shapes are formed on an upper side and a lower side of the rear surface plate 103. When the plurality of solar cell modules 100 are arranged, the engaging part 103d on the upper side of the lower solar cell module 100 and the engaging part 103e on the lower side of the upper solar cell module 100 are engaged with each other.

When arranging the plurality of solar cell modules 100 of this structure, the adjacent solar cell modules 100 in right and left directions are fixed with together by the screw 106 inserted in the holes 103b, 103c, and are electrically connected. In this way, all of the solar cell modules 100 arranged in left and right directions are electrically connected each other by the screws.

The solar cell modules 100, 100 adjacent in up and down directions are electrically connected because the engaging parts 103d, 103e of the rear surface plates 103, 103 are closely contact with each other. Therefore, all of the solar cell modules 100 arranged in up and down directions are electrically connected.

In this structure, all of the arranged solar cell modules 100 are electrically connected with each other, therefore all of the modules are grounded by one grounding. In this way, the grounding of all of the modules is easily achieved.

Figure 24:
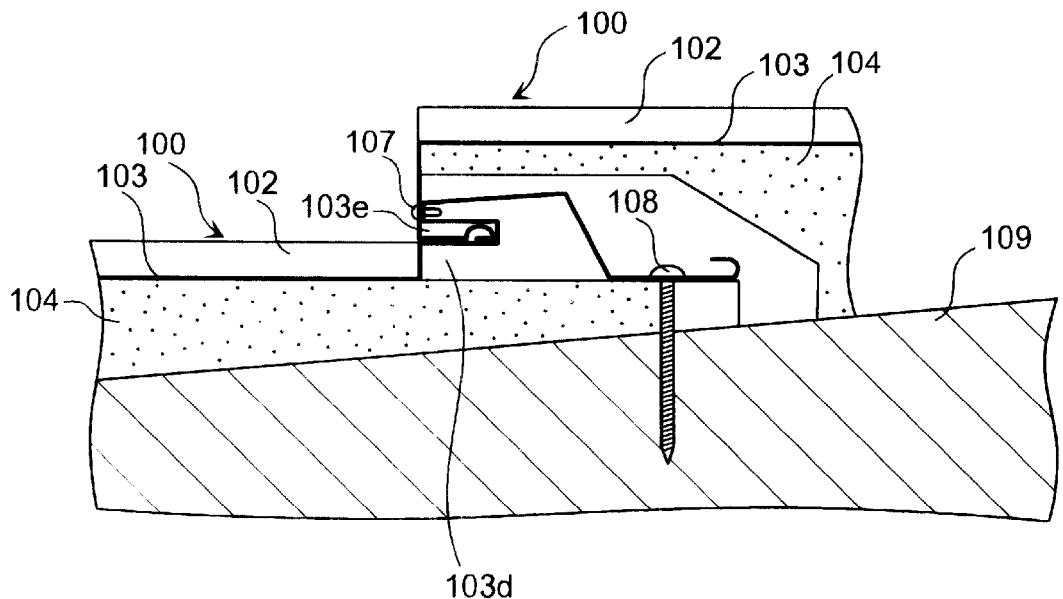
FIG. 24 is a cross sectional view illustrating that the upper and lower solar cell modules are fixed by a screw.

When a surface of the rear surface plate 103 is coated for preventing corrosion and is insulated, the solar cell modules 100, 100 adjacent in up and down directions may not be electrically connected. In such a case, the engaging parts 103d, 103e which are made contact with each other may be fixed by a screw. FIG. 24 is a cross sectional view illustrating the upper and lower solar cell modules 100, 100 are fixed by the screw.

The elements in FIG. 24 which are same as of FIGS. 22, 23 have the same reference numerals and explanation on them is omitted. The engaging part 103d on an upper side of the lower solar cell module 100 and the engaging part 103e on a lower side of the upper solar cell module 100 are fixed by the screw 107. Then, the solar cell modules 100, 100 adjacent in up and down directions are securely electrically connected by the screw. Each of the solar cell modules 100 is fixed on a roofboard 109 by a screw 108.

Figure 25:
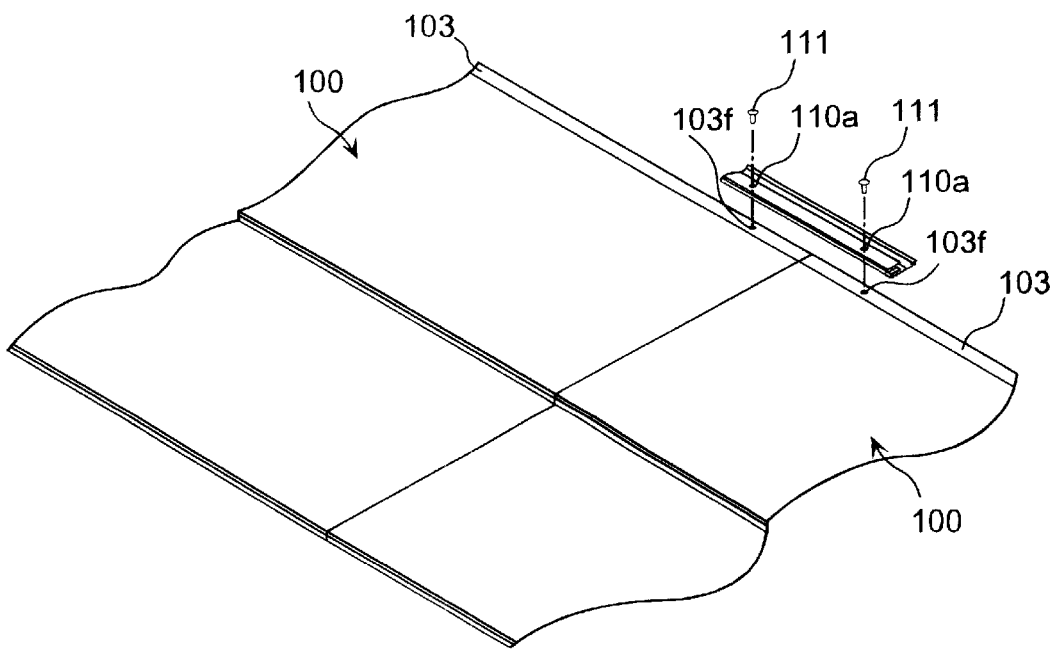
FIG. 25 is a perspective view illustrating one example of arrangement of the plurality of the solar cell modules of this invention.

FIG. 25 is a perspective view illustrating another example of arrangement of the plurality of solar cell modules of this invention. In this example, the adjacent solar cell modules 100, 100 are electrically connected by using a part different from the rear surface plate 103.

In FIG. 25, the adjacent solar cell modules 100, 100 are fixed and electrically connected by a connecting part 110. The connecting part 110 is formed with steel as like the rear surface plate 103. A hole 110a for inserting a screw is formed on the connecting part 110. A hole 103f for inserting a screw is formed on one side of the rear surface plate 103 of the solar cell module 100. The connecting part 110, the solar cell modules 100, 100 are positioned so that the holes 110a, 103f correspond with each other, and the screw 111 is inserted in the holes 110a, 103f so that the solar cell modules 100, 100 are fixed and electrically connected with each other.

In this structure, when arranging the plurality of solar cell modules, the adjacent solar cell modules 100, 100 are electrically connected. Thus, even when the plurality of solar cell modules are integrally arranged on lumbers without using a frame, all of the arranged solar cell modules 100 are electrically connected with each other, therefore all of the modules are grounded by one grounding. In this way, time and cost necessary for arranging the solar cell module can be reduced.

The adjacent solar cell modules 100, 100 are electrically connected by the screw. Thus, even when a surface of the rear surface plate 103 are coated for preventing corrosion, the adjacent solar cell modules 100, 100 can be securely electrically connected. The solar cell modules are connected by using the screw for fixing the modules, thus time for grounding is not necessary, and time and cost necessary for arranging a solar cell module can be further reduced.

When the solar cell module manufactured by the processes of FIGS. 6–9 is allowed to stand in the atmosphere of 85° C. and 93% humidity for 1000 hours, the property degrades by 15–20% as compared with before. Operating voltage of a single laminated photovoltaic element comprising amorphous semiconductor is approximately 1V, and a potential difference between the adjacent photovoltaic elements 2, 2 are as little as 1V. On the other hand, when a plurality of groups of integrated elements are arranged in parallel in order to output a high voltage, greater potential difference is generated between the groups of the integrated elements. In this case, occurrence of leak current between the photovoltaic elements which form the groups of integrated elements 30, 40 becomes a problem.

In the above embodiment, the adhesive layer 5 is improved so as not to generate leak current through moisture when the moisture penetrates the adhesive layer 5.

Figure 26:
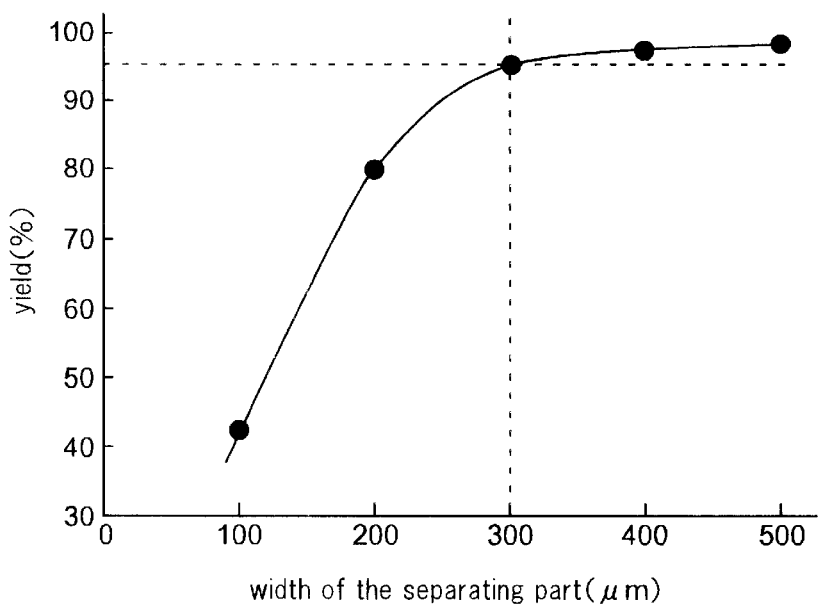
FIG. 26 is a characteristic graph showing relations between a width of a separating part of the solar cell module and the yield.

The inventors have considered that occurrence of leak current between the photovoltaic elements which form the groups of integrated elements 30, 40 is eliminated by varying a width of the separating part 50. The inventors produced the solar cell modules structured as shown in FIG. 3 with various widths of the separating part 50 and tested the reliability. FIG. 26 is a chart indicating the resulted properties. A width of the separating part 50 is taken along a horizontal axis, yields when the lowering rate of the photovoltaic conversion property of after is not higher than 5% is taken along a vertical axis. The operating voltage of the solar cell module is 100V.

When the operating voltage of the solar cell module is 100V and the width of the separating part 50 is not less than 300 $\mu$m, the yield is improved to more than 95%. When the operating voltage of all the solar cell modules is doubled and tripled, electric field applied between the opposite photovoltaic elements which sandwich the separating part is made equal by doubling and tripling the width of the separating part, thus occurrence of leak current through the separating part can be restrained.

When the operating voltage of the whole module is 100V, for example in the solar cell module of FIG. 3, a potential difference of 100V is generated between the photovoltaic element on a right end of the first group of integrated elements 30 and the photovoltaic element on a right end of the second group of integrated elements 40. As indicated in FIG. 26, when the width of the separating part 50 formed between the photovoltaic elements is 300 $\mu$m, the yield is improved. The width of the separating part 50 in this case is a sum of each of a plurality of grooves which form the separating part.

When the potential difference between the two photovoltaic elements is 200V, the width of the separating part 50 between the two photovoltaic elements may be 600 $\mu$m. When the potential difference is 300V, the width of the separating part 50 may be 900 $\mu$m.

When the relational expression 1 is satisfied, leak current generating between two photovoltaic elements can be suppressed; in the relational expression 1, a potential difference between the two adjacent photovoltaic elements is V(v) and a width of the separating part of the two photovoltaic elements is D($\mu$m).

$$D(\mu m) \geq 3 \times V(V) \qquad \text{Relational Expression 1}$$

In order to restrain an occurrence of leak current between the groups of integrated elements of the solar cell module provided with a plurality of groups of integrated elements arranged in parallel, a width of the separating part between the groups of integrated elements is determined on the basis of a maximum potential difference among potential differences occurring between the adjacent photovoltaic elements so as to satisfy the relational expression 1. For example, in a solar cell module which is provided with two groups of integrated elements arranged in two parallel lines and outputs an operating voltage of 200V, a width of the separating part between the two groups of integrated elements may be not less than 600 μm on the basis of the maximum potential difference 200V of the potential differences generated between the adjacent photovoltaic elements so as to satisfy the relational expression 1.

In a solar cell module which is provided with three groups of integrated elements arranged in three parallel lines and outputs an operating voltage of 300V, an operating voltage of one group of integrated elements is 100V. Therefore, a width of the separating part between each of the groups of integrated elements may be not less than 300 μm on the basis of the maximum potential difference 100V among potential differences occurring between the adjacent photovoltaic elements so as to satisfy the relational expression 1.

Figure 27:
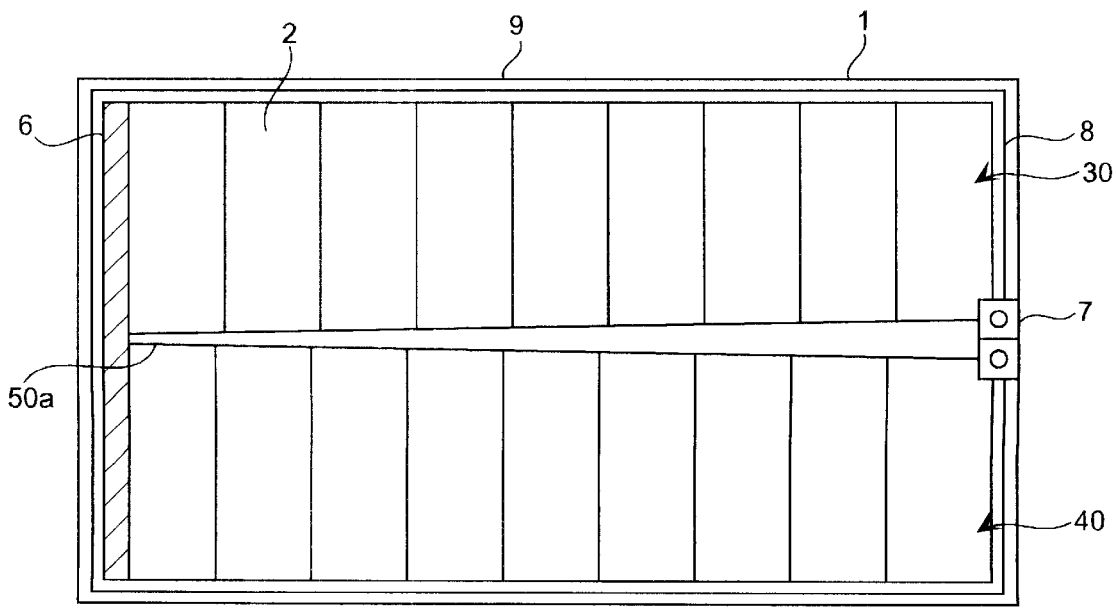
FIG. 27 is a plan view illustrating another solar cell module of this invention.

Widths of the separating part between the groups of integrated elements is not necessary to be uniform. For example, as shown in FIG. 27, a width of an area of small potential difference in the separating part between the photovoltaic elements oppositely arranged by sandwiching the separating part may be small and a width in an area of large potential difference may be large.

Any of widths of the separating part 50 can be applicable as long as the relational expression 1 is satisfied. However, too large width may cause reduction of effective area, resulting in lowered photovoltaic conversion property. Thus, an upper limit should be determined appropriately. When the weatherable insulating material 58 is provided on the separating part 50 of the above described width, moisture is prevented from penetrating the separating part 50 which is applied high voltage, and short circuit at the separating part 50 is securely prevented. In using the adhesive layer which has no adhesive area corresponding to the separating part 50, leak current through the moisture is prevented from occurring between the groups of integrated elements 30, 40 even when moisture penetrates the adhesive layer 5.

Although the present invention has been described and illustrated in detail, it is clearly understood that the same is and example only and is not to be taken by way of limitation by way of illustration, the spirit and scope of the present invention being limited only by the terms of the appended claims.

What is claimed is:

1. A solar module comprising, a substrate having an insulating surface, a group of integrated elements including a plurality of photovoltaic elements electrically connected in series on the substrate, a separating part for electrically separating a plurality of the groups of integrated elements arranged in parallel on the substrate, a connecting member for electrically connecting the plurality of the groups of integrated elements in series with each other, rear surface member provided on rear surface sides of the plurality of the groups of integrated elements, and an adhesive layer containing resin for adhering the rear surface member on the rear surface side of the plurality of the groups of integrated elements, wherein the adhesive layer is provided so as to cover the rear surface of the group of integrated elements except for an area corresponding to the separating part.

2. The solar cell module according to claim 1, wherein a groove is formed on the substrate by exposing the insulating surface of the substrate so as to surround the plurality of the groups of integrated elements.

3. The solar cell module according to claim 2, wherein the adhesive layer is formed so as to cover the rear surface of the group of integrated elements for an area corresponding to the groove.

4. The solar cell module according to claim 1, wherein the photovoltaic elements each comprise an amorphous semiconductor.

5. The solar cell module according to claim 1, wherein a protective layer containing resin is formed on a whole rear surface of the plurality of the groups of integrated elements including the separating part.

6. The solar cell module according to claim 5, wherein a moisture proof member is provided on the protective layer positioned on the separating part.

7. The solar cell module according to claim 5, wherein a moisture proof member is provided on the separating part and the protective layer is provided thereon.

8. The solar cell module according to claim 1, wherein the connecting member comprises a lead wire, and an insulating film is formed between the lead wire and the rear surface of the plurality of the groups of integrated elements.

9. An solar cell module containing an amorphous semiconductor and comprising, a substrate having an insulating surface, a group of integrated elements including a plurality of photovoltaic elements electrically connected in series on the insulating surface of the substrate, a separating part for electrically separating a plurality of the groups of integrated elements arranged in parallel on the substrate, a connecting member for electrically connecting the plurality of the groups of integrated elements in series with each other, a rear surface member provided on rear surface sides of the plurality of the groups of integrated elements, and an adhesive layer containing resin for adhering the rear surface member on the rear surface side of the plurality of the groups of integrated elements, wherein a width of the separating part located between adjacent groups of integrated elements is determined depending on a potential difference generated between adjacent photovoltaic elements which sandwich the separating part to prevent current leakage between the photovoltaic elements.

10. The solar cell module according to claim 9, wherein the separating part is formed by exposing the insulating surface of the substrate.

11. The solar cell module according to claim 9, wherein a width (D) of the separating part satisfies the relational expression $D(\mu m) \geq 3 \times V(V)$ wherein V is said potential difference.

12. The solar cell module according to claim 9, wherein the adhesive layer is formed so as to cover the rear surface of the group of integrated elements except for an area corresponding to the separating part.

13. The solar cell module according to claim 12, wherein a groove is formed on the substrate by exposing the insulating surface of the substrate so as to surround the plurality of the groups of integrated elements.

14. The solar cell module according to claim 13, wherein the adhesive layer is formed so as to cover the rear surface of the group of integrated elements except for an area corresponding to the groove.

15. The solar cell module according to claim 9, wherein the photovoltaic elements each comprise an amorphous semiconductor.

16. The solar cell module according to claim 9, wherein a protective layer containing resin is formed on a whole rear surface of the plurality of the groups of integrated elements including the separating part.

17. The solar cell module according to claim 16, wherein a moisture proof member is provided on the protective layer positioned on the separating part.

18. The solar cell module according to claim 16, wherein a moisture proof member is provided on the separating part, and the protective layer is provided thereon.

19. The solar cell module according to claim 9, wherein the connecting member comprises a lead wire, and an insulating film is formed between the lead wire and the rear surface of the plurality of the groups of integrated elements.

* * * * *